US007816939B2

(12) United States Patent
Jeon et al.

(10) Patent No.: US 7,816,939 B2
(45) Date of Patent: Oct. 19, 2010

(54) LIQUID CRYSTAL DISPLAY PANEL AND TESTING AND MANUFACTURING METHODS THEREOF

(75) Inventors: Jin Jeon, Suwon-si (KR); Min Kyung Jung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/611,505

(22) Filed: Nov. 3, 2009

(65) Prior Publication Data

US 2010/0045639 A1 Feb. 25, 2010

Related U.S. Application Data

(60) Continuation of application No. 12/276,936, filed on Nov. 24, 2008, now Pat. No. 7,622,941, which is a division of application No. 11/454,463, filed on Jun. 16, 2006, now Pat. No. 7,456,647.

(30) Foreign Application Priority Data

Jul. 19, 2005 (KR) .......................... 10-2005-65284

(51) Int. Cl.
*G01R 31/00* (2006.01)

(52) U.S. Cl. ..................................................... 324/770

(58) Field of Classification Search ............. 324/158.1, 324/537, 750–765, 770; 345/930, 32, 55, 345/99, 204–206; 714/718–720
See application file for complete search history.

(56) References Cited

U.S. PATENT DOCUMENTS 7,362,124 B2 * 4/2008 Kim et al. ................... 324/770
7,365,562 B2 * 4/2008 Jeon ........................... 324/770

* cited by examiner

*Primary Examiner*—Minh N Tang
*Assistant Examiner*—Trung Q Nguyen
(74) *Attorney, Agent, or Firm*—F. Chau & Associates, LLC

(57) ABSTRACT

A liquid crystal display (LCD) panel simplifying its testing and manufacturing. The LCD panel includes (formed on a substrate) gate lines, data lines, and pixels including pixel transistors. The LCD panel further includes a plurality test transistors (e.g., data test transistors for driving the odd and even data lines) formed in a package region of a driving IC (integrated circuit) configured to drive the data lines. The plurality of test transistors may be selectively activated (turned ON) during testing before the driving integrated circuit (Driver IC package) is attached (e.g., fixed) to the driving IC package region. The LCD panel may further include a plurality of gate test transistors configured to drive the odd and even gate lines.

16 Claims, 11 Drawing Sheets

LIQUID CRYSTAL DISPLAY PANEL AND TESTING AND MANUFACTURING METHODS THEREOF

CROSS-REFERENCE TO RELATED APPLICATION

This application is a continuation of U.S. patent application Ser. No. 12/276,936 filed on Nov. 24, 2008, now U.S Pat. No. 7,622,941 which is a divisional of U.S. patent application Ser. No. 11/454,463, filed Jun. 16, 2006, now U.S. Pat. No. 7,456,647 which claims priority to Korean Patent Application No. 2005-65284 filed on Jul. 19, 2005, the disclosures of which are all incorporated by reference herein in their entirety.

BACKGROUND OF THE INVENTION

1. Field of the Invention

The present invention relates to a liquid crystal display (LCD) panel, and more particularly, to a LCD panel capable of simplifying testing and manufacturing methods thereof.

2. Description of the Related Art

A liquid crystal display (LCD) displays images by controlling the light transmittance through a liquid crystal layer by applying an electric field based on received image data signals. The LCD includes an LCD panel in which liquid crystal cells are arrayed in a matrix, and a driving circuit (e.g., disposed in a peripheral area adjacent to the pixel array) for driving the LCD panel based on the received image data signals.

The pixel array of the LCD panel includes a thin film transistor (TFT) substrate (comprising a plurality of TFTs corresponding to the plurality of pixels) and a color filter substrate (e.g., a matrix of Red, Green, Blue filters) that face each other with the liquid crystal material disposed between the two substrates, and a spacer for maintaining a cell gap between the two substrates.

The thin film transistor substrate has gate lines, data lines, thin film transistors TFTs (e.g., used as switches in each of the liquid crystal cells) formed at the intersections of the gate lines and the data lines, pixel electrodes connected to the thin film transistors TFTs, and an alignment film coated upon those elements. The gate lines and data lines receive signals from the (peripheral) driving circuit(s) at their respective pads. The data lines transmit pixel signals to the pixel electrodes (source electrodes of the TFTs) that are apply an electric field to the liquid crystal in response to scan signals (received at the gate of the TFTs) transmitted by the gate lines.

The color filter substrate includes color filters formed over each of liquid crystal cells, a black matrix for separating the color filters from one another and for reflecting external light, a common electrode for supplying a reference (e.g., ground) voltage to all the liquid crystal cells, and an alignment film coated on all those elements.

The thin film transistor substrate and the color filter substrate are separately manufactured and then assembled. A liquid crystal is injected between the two substrates and then the substrates are sealed, thereby forming an LCD.

The thin film transistor TFT substrate is subjected to testing process after manufacture for detecting defects in signal lines (by determining whether the signal lines are shorted or opened) and defects in the thin film transistors TFTs. Shorting bars are connected to the data and scan lines around the periphery of the display and are cut after processing. For this signal testing process, the thin film transistor substrate provides an odd shorting bar and an even shorting bar which separately connect the gate lines and the data lines to odd lines and even lines, respectively. These shorting bars are formed in a non-display (peripheral) region and may be removed by a scribing, grinding, or laser trimming process after the testing process. During this removing process, a pollutant may occur, or signal lines may corrode due to moisture or other contaminants injected through a cut surface, thereby degrading reliability. Therefore, a manufacturing method or testing process capable of omitting the shorting bars and the shorting bar removing process is desirable.

In the conventional LCD, after the testing process if the panel passes, a semiconductor integrated circuit (IC) chip, such as a Driver IC, and/or an IC Package (comprising the IC chip and a plurality of conductive patterns) is physically and electrically attached to the substrate in a predetermined Driver IC package region in the non-display (peripheral) region of one of the substrates. The shorting bars etc. are formed outside of the predetermined Driver IC package region, e.g., in another part of the non-display (peripheral) region. After the testing process, if the LCD panel is judged to be of good quality, a driver IC is fixed in the Driver IC package region in the peripheral region.

SUMMARY OF THE INVENTION

An aspect of the present invention provides an LCD panel capable of simplifying testing and manufacturing methods thereof, for example, by obviating the conventional shorting bars and the corresponding shorting bar removing process.

In accordance with an aspect of the present invention, there is provided a liquid crystal display panel including gate lines (formed on a substrate), data lines (intersecting the gate lines), pixel transistors connected to the gate lines and the data lines (at pixel regions at their intersections), pixel electrodes connected to the pixel transistors (formed in the pixel regions), and a plurality test transistors (formed in a predetermined package region provided for attaching a driving integrated circuit) configured to drive the gate lines and/or the data lines. The plurality of test transistors may include odd data test transistors connected to odd data lines among the data lines, and even data test transistors connected to even data lines among the data lines. The plurality of test transistors may further include odd gate test transistors connected to odd gate lines among the gate lines, and even gate test transistors connected to even gate lines among the gate lines.

The plurality of test transistors is turned ON or (permanently) OFF depending on whether the driving integrated circuit (Diver IC) package is attached or not. The plurality of test transistors are selectively activated (turned ON) during testing before the driving integrated circuit (Driver IC package) is attached (e.g., fixed) onto the LCD Panel. The plurality of test transistors are inactivated (permanently turned OFF) when the driving integrated circuit (Driver IC package) is attached (e.g., fixed) on the LCD Panel.

Thus, the plurality of test transistors is permanently turned OFF if the driving integrated circuit (Driver IC package) is attached.

The liquid crystal display panel may further include an odd data test line and an odd data test pad for supplying a data test signal to the odd data test transistors; an even data test line and an even data test pad for supplying the data test signal to the even data test transistors; and a data control line and a data control pad for supplying a control signal to the gates of the odd and even data test transistors.

The liquid crystal display panel may further include an odd gate test line and an odd gate test pad for supplying a gate test signal to the odd gate test transistors; an even gate test line and an even gate test pad for supplying the gate test signal to the even gate test transistors; an odd gate control line and an odd gate control pad for supplying a control signal to the gates of the odd gate test transistors; and an even gate control line and even gate control pad for supplying the control signal to the gates of the even gate test transistors.

The liquid crystal display panel may further include a gate driver (e.g., formed at one side of the substrate) to drive the gate lines.

The liquid crystal display panel may further include a signal supplying pad formed in the predetermined Driver IC package region, for supplying a driving signal to the gate driver.

The liquid crystal display panel may further include a test signal supplying pad connected commonly with the signal supplying pad, for supplying a test signal during a testing process.

In accordance with another aspect of the present invention, there is provided a method (e.g., a method of testing a liquid crystal display panel). The method includes the steps of providing a liquid crystal display panel that includes gate lines (e.g., formed on a substrate), data lines intersecting the gate lines, pixel transistors connected to the gate lines and the data lines, pixel electrodes connected to the pixel transistors, and a plurality of test transistors (e.g., formed in a predetermined package region provided for future attachment of a driving integrated circuit, e.g., Driver IC package) for driving at least one of the gate lines and the data lines, The method may further comprise checking whether the liquid crystal display panel has a defect by using (e.g., selectively activating) the plurality of test transistors.

The providing step may include the substep of forming test transistors including odd data test transistors connected to odd data lines among the data lines and even data test transistors connected to even data lines among the data lines.

The checking step may include the substeps of: sequentially supplying each of the gate lines with a gate test signal generated by a gate driver formed at one side of the substrate; and supplying the odd data lines with a data test signal; and again sequentially supplying the gate lines with the gate test signal generated by the gate driver formed at one side of the substrate; and supplying the even data lines with the data test signal.

The providing step may further include the substep of forming test transistors including odd gate test transistors connected to odd gate lines among the gate lines and even gate test transistors connected to even gate lines among the gate lines.

The checking step may include the substeps of simultaneously supplying (through the odd gate test transistors) a gate test signal to all the odd gate lines, supplying a data test signal (through the odd data test transistors) to the odd data lines. And then, simultaneously applying the gate test signal to all the even gate lines (through the even gate test transistors), and supplying the data test signal to the even data lines (through the even data test transistors).

In accordance with still another aspect of the present invention, there is provided a method for manufacturing a liquid crystal display panel that includes gate lines (formed on a substrate), data lines intersecting the gate lines, pixel transistors connected to the gate lines and the data lines, and pixel electrodes connected to the pixel transistors. The method includes the step of forming a plurality of test transistors (e.g., formed in a predetermined package region of a driving integrated circuit) for driving at least one of the gate lines and the data lines.

The forming step may include the step of forming odd data test transistors connected to odd data lines among the data lines and even data test transistors connected to even data lines among the data lines.

The method may further include the step of forming: an odd data test line and an odd data test pad for supplying a data test signal to the odd data test transistors; an even data test line and an even data test pad for supplying the data test signal to the even data test transistors; and a data control line and a data control pad for supplying a control signal to the odd and even data test transistors.

The forming step further includes the step of forming odd gate test transistors connected to odd gate lines among the gate lines and even gate test transistors connected to even gate lines among the gate lines.

The method may further include the step of forming an odd gate test line and an odd gate test pad for supplying a gate test signal to the odd gate test transistors; an even gate test line and an even gate test pad for supplying the gate test signal to the even data test transistors; an odd gate control line and an odd gate control pad for supplying a control signal to the odd gate test transistors; and an even gate control line and an even gate control pad for supplying the control signal to the even gate test transistors.

The method may further include the step of forming on the substrate a gate driver for sequentially driving each of the gate lines (e.g., instead of providing gate test transistors and gate control lines).

The method may further include the step of forming in the predetermined package region a signal supplying pad for supplying a driving signal to the gate driver.

The method may further include the step of forming a test signal supplying pad commonly connected with the signal supplying pad and to which a test signal is supplied during a testing process.

BRIEF DESCRIPTION OF THE DRAWINGS

The above and other features of the present invention will become more apparent to persons skilled in the art from the following detailed description of exemplary embodiments shown in the accompanying drawings, in which.

DETAILED DESCRIPTION OF THE PREFERRED EMBODIMENTS

Figure 1:
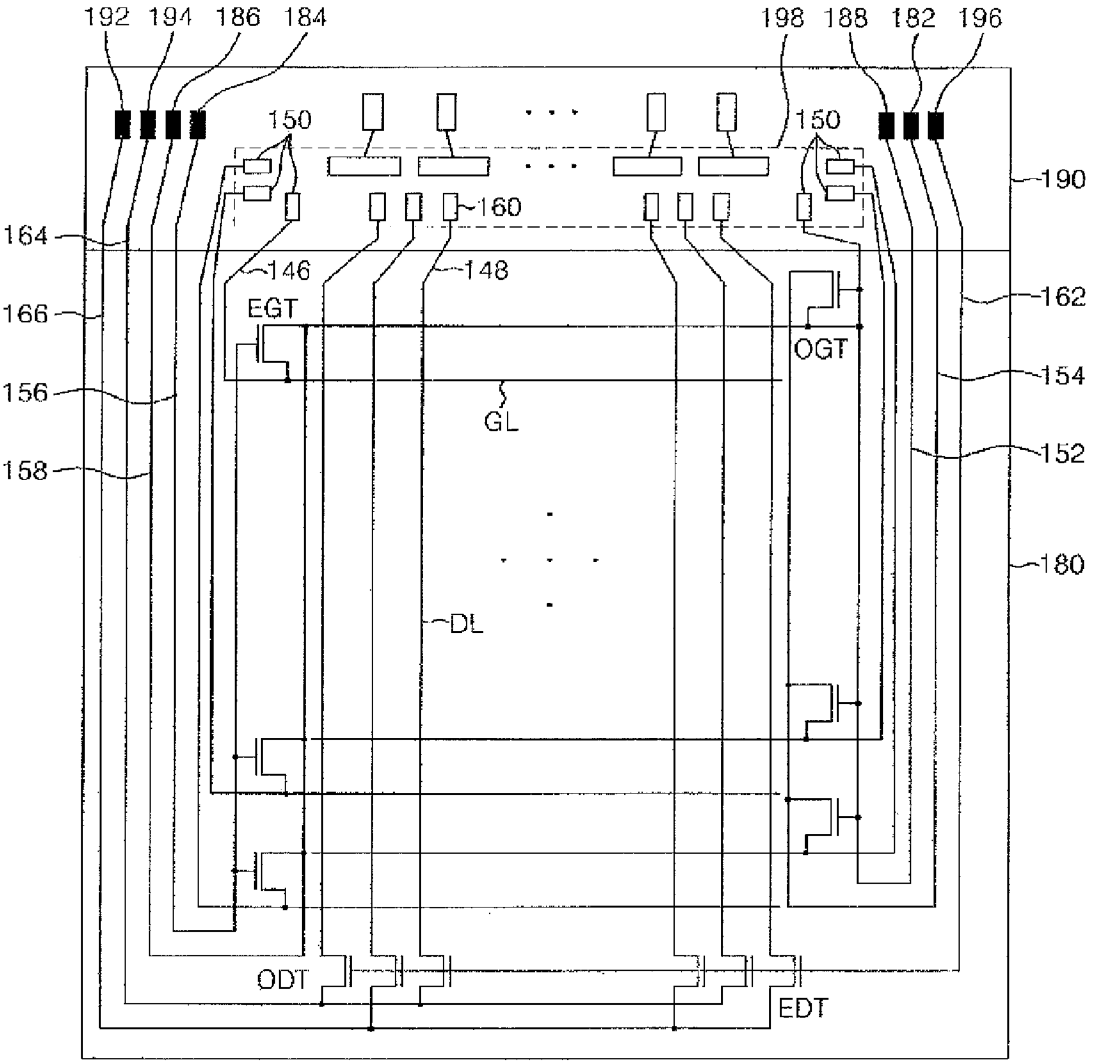
FIG. 1 is a plane view of an LCD panel according to a first embodiment of the present invention.

FIG. 1 is a plane view illustrating an LCD panel according to a first embodiment of the present invention.

The LCD panel shown in FIG. 1 includes a display area 180 and a peripheral area 190. The display area 180 includes a plurality of odd and even data test transistors ODT and EDT connected to data lines DL (DL1, DL2, DL3, DL4, . . . ) (in a display region of the display area 180), and a plurality of odd and even gate test transistors OGT and EGT connected to gate lines GL in the display region. After the testing process if the panel passes, a semiconductor integrated circuit (IC) chip, such as a Driver IC, and/or an IC Package is physically and electrically attached to the substrate in a predetermined package region 198 for receiving the Driver IC package in the non-display (peripheral) region 190. The "package region" receives the Driver IC "package". In various embodiments, the Driver IC "package" may comprise a Driver IC chip plus a mounting board and plurality of conductive patterns. In other embodiments, (e.g., "flip chip" Driver IC "package" may consist essentially of the Driver IC chip. In all embodiments, the driving IC "package region" is predetermined and provided and configured to receive the Driver IC "package" (of whatever form it may be) when it will be attached (e.g., after successful testing). The odd data test transistors ODT switchably transmit a data test signal, received through an odd data test pad 194 and line 164, to the odd data lines DL1, DL3, . . . in response to a data control signal received through a data control pad 196 and line 162.

The even data test transistors EDT switchably transmit a data test signal, received through an even data test pad 192 and line 166, to the even data lines DL2, DL4, . . . in response to the data control signal received from the data control pad 196 and line 162.

The odd gate test transistors OGT switchably transmits an odd gate test signal, received through an odd gate test pad 182 and line 154, to odd gate lines GL1, GL3, . . . in response to an odd gate control signal received from an odd gate control pad 188 and line 152.

The even gate test transistors EGT switchably transmit an even gate test signal, received from an even gate test pad 186 and line 158, to even gate lines GL2, GL4, . . . in response to an even gate control signal received from an even gate control pad 184 and line 156.

During a testing process of the LCD panel, the test transistors (comprised of the odd and even data test transistors ODT and EDT and the odd and even gate test transistors OGT and EGT) are turned ON to check for defects in the signal lines (gate lines GL, and data lines DL). During a normal image displaying mode (a data driving operation), the test transistors are turned OFF and the LCD panel is driven by using data and gate signals generated from a driving integrated circuit (IC) in the predetermined package region 198 for receiving the Driver IC package.

Thus the LCD panel according to the first embodiment of the present invention tests for defects in signal lines (DL, GL) and pixel transistors by using the test transistors positioned in the driving IC package region 198. Therefore, the above LCD panel does not require shorting bars, nor a process for removing the shorting bars, thus simplifying testing and manufacturing.

The LCD panel according to the first embodiment of the present invention may require additional space for arranging the test transistors (EDT, ODT, EGT and OGT) because they are positioned outside of the pixel array of in the display area 180. Moreover, since the area of a black matrix is increased by the area occupied on a substrate by the test transistors EDT, ODT, EGT and OGT, the ratio of the display region decreases. Further, since the test lines 154, 158, 164 and 166 and the control lines 152, 156 and 162 are formed to encompass the display region of the LCD panel, the lines 154, 158, 164, 166, 152, 156 and 162 are relatively increased in length. Thus, a time constant RC of resistances R and capacitors C contained in the test lines 154, 158, 164 and 166 and the control lines 152, 156 and 162 increases and thereby the test signals and the control signals may be distorted. Furthermore, since the test signals do not pass through a data pad 160, a data link 148, a gate pad 150 and a gate link 146 during the testing process, the LCD panel can not detect defects in the signal links 146 and 148.

Figure 2:
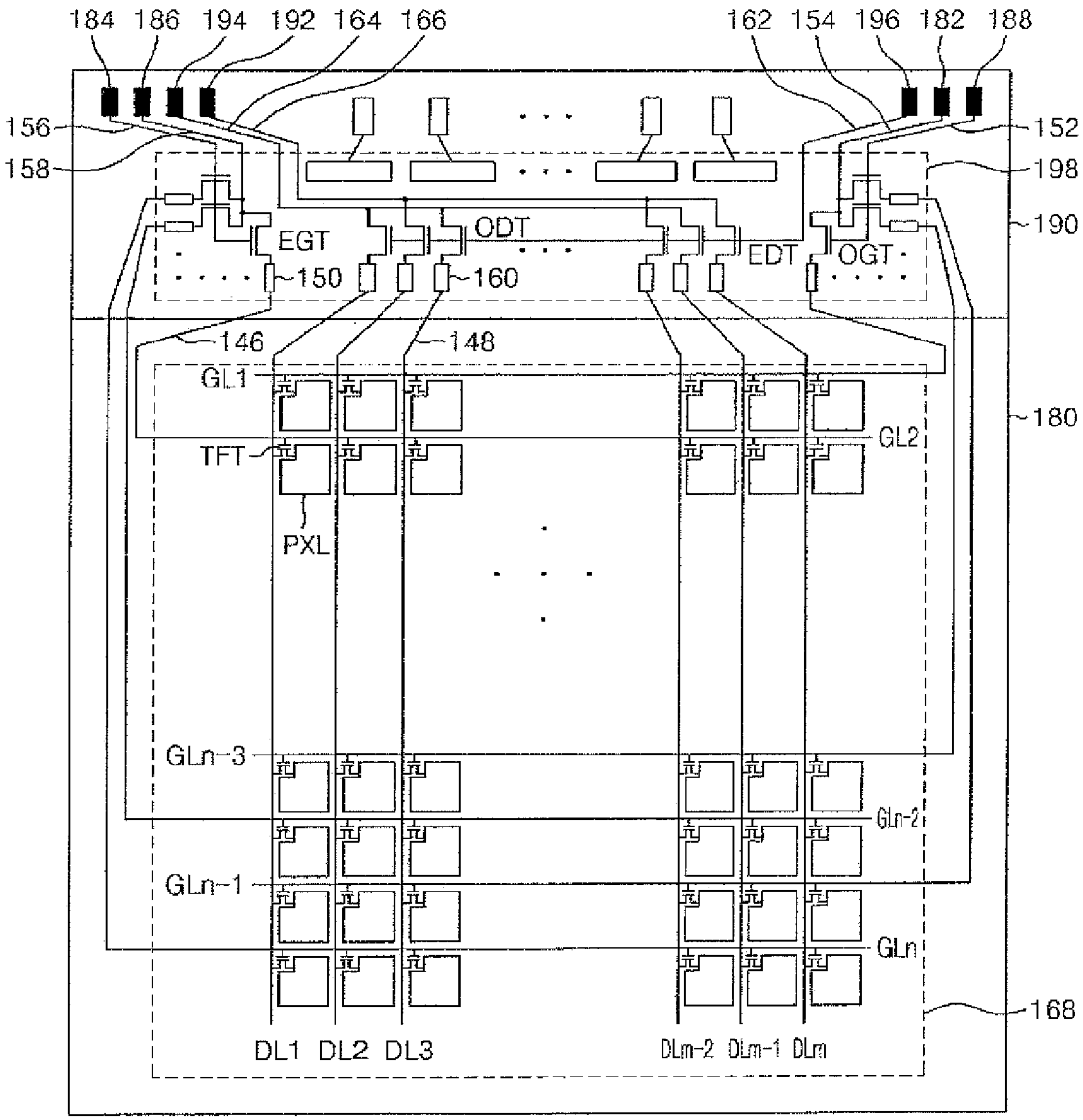
FIG. 2 is a plane view of an LCD panel according to a second embodiment of the present invention.

FIG. 2 is a plane view illustrating an LCD panel according to a second embodiment of the present invention. The LCD panel shown in FIG. 2 includes a display area 180 and a peripheral area 190.

The LCD panel shown in FIG. 2 includes pixel transistors TFT and pixel electrodes PXL formed in pixel regions at the intersections of gate lines GL and data lines DL, odd and even data test transistors ODT and EDT connected to the data lines DL in the display region 168, and odd and even gate test transistors OGT and EGT connected to the gate lines GL in the display region 168.

The odd data test transistors ODT include respective transistor gate electrodes (connected to a data control pad 196 and line 162), respective transistor source electrodes (connected to an odd data test pad 194 and line 164), and respective drain electrodes (connected through odd data pads 160 to odd data lines DL1, DL3, . . . , DLm−1). The odd data test transistors ODT switchably apply to the odd data lines DL1, DL3, . . . , DLm−1 a data test signal (received from the data test pad 194 and line 164) in response to a data control signal received from the data control pad 196 and line 162. Since the odd data test transistors ODT are formed within a driving IC package region 198, the area utilization efficiency of the substrate is improved. Since the driving IC "package region" is predetermined and is normally already provided and configured to receive the Driver IC "package" when it will be attached (e.g., after successful testing), the additional formation of the odd data test transistors ODT within the driving IC "package region" reuses that space and thus conserves space and avoids the use of space on other portions of the substrate.

The even data test transistors EDT include respective transistor gate electrodes (connected to the data control pad 196 and line 162), respective transistor source electrodes (connected to an even data test pad 192 and line 166), and respective transistor drain electrodes (connected through even data pads 160 to even data lines DL2, DL4, . . . , DLm. The even data test transistors EDT switchably apply to the even data lines DL2, DL4, . . . , DLm a data test signal (received from the data test pad 192 and line 166) in response to the data control signal received from the data control pad 196 and line 162. Since the even data test transistors EDT are formed within the driving IC package region 198, the area utilization efficiency of the substrate is improved.

The odd gate test transistors OGT include respective transistor gate electrodes (connected to an odd gate control pad 188 and line 152), respective transistor source electrodes (connected to an odd gate test pad 182 and line 154), and respective transistor drain electrodes (connected through odd gate pads 150 to odd gate lines GL1, GL3, . . . , GLn−1). The odd gate test transistors OGT switchably apply to the odd gate lines GL1, GL3, . . . , GLn−1 a gate test signal (received from the odd gate test pad 182 and line 154) in response to a gate control signal received from the odd gate control pad 188 and line 152. Since the odd gate test transistors OGT are formed within the driving IC package region 198, the area utilization efficiency of the substrate is improved.

The even gate test transistors EGT include respective transistor gate electrodes (connected to an even gate control pad 184 and line 156), respective transistor source electrodes (connected to an even gate test pad 186 and line 158), and respective transistor drain electrodes (connected through even gate pads 150 to even gate lines GL2, GL4, . . . , GLn). The even gate test transistors EGT switchably apply to the even gate lines GL2, GL4, . . . , GLn a gate test signal (received from the even gate test pad 186 and line 158) in response to a gate control signal received from the gate control pad 184 and line 156. Since the even data test transistors EGT are formed within the driving IC package region 198, the area utilization efficiency of the substrate is improved.

Thus defects in the signal lines and the thin film transistors are detected by activating the odd and even data test transistors ODT and EDT and the odd and even gate test transistors OGT and EGT shown in FIG. 2.

This signal testing process will be described in more detail hereinafter with reference to FIGS. 3, 4A and 4B.

Figure 3:
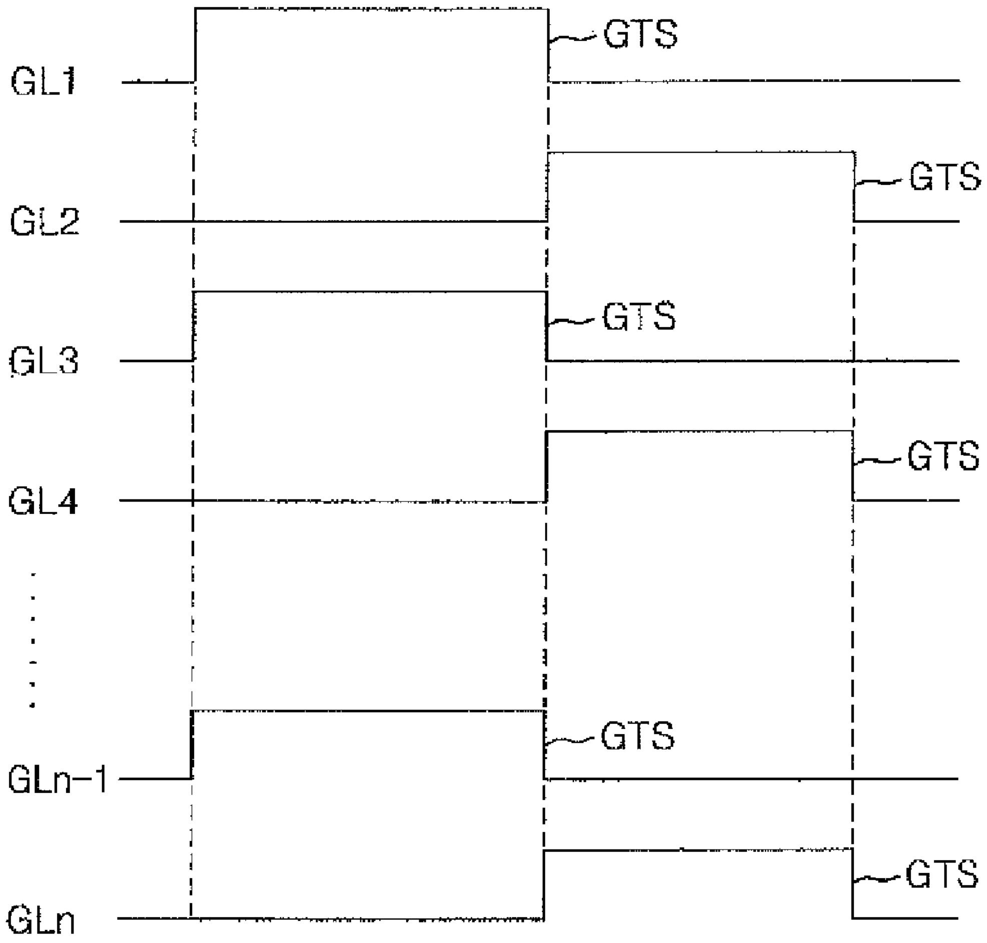
FIG. 3 is a waveform diagram illustrating a gate test signal applied to gate lines during a testing process of the LCD panel of FIG. 2.

FIG. 3 is a waveform diagram illustrating a gate test signal applied to gate lines during a testing process of the LCD panel of FIG. 2.

Figure 4A:
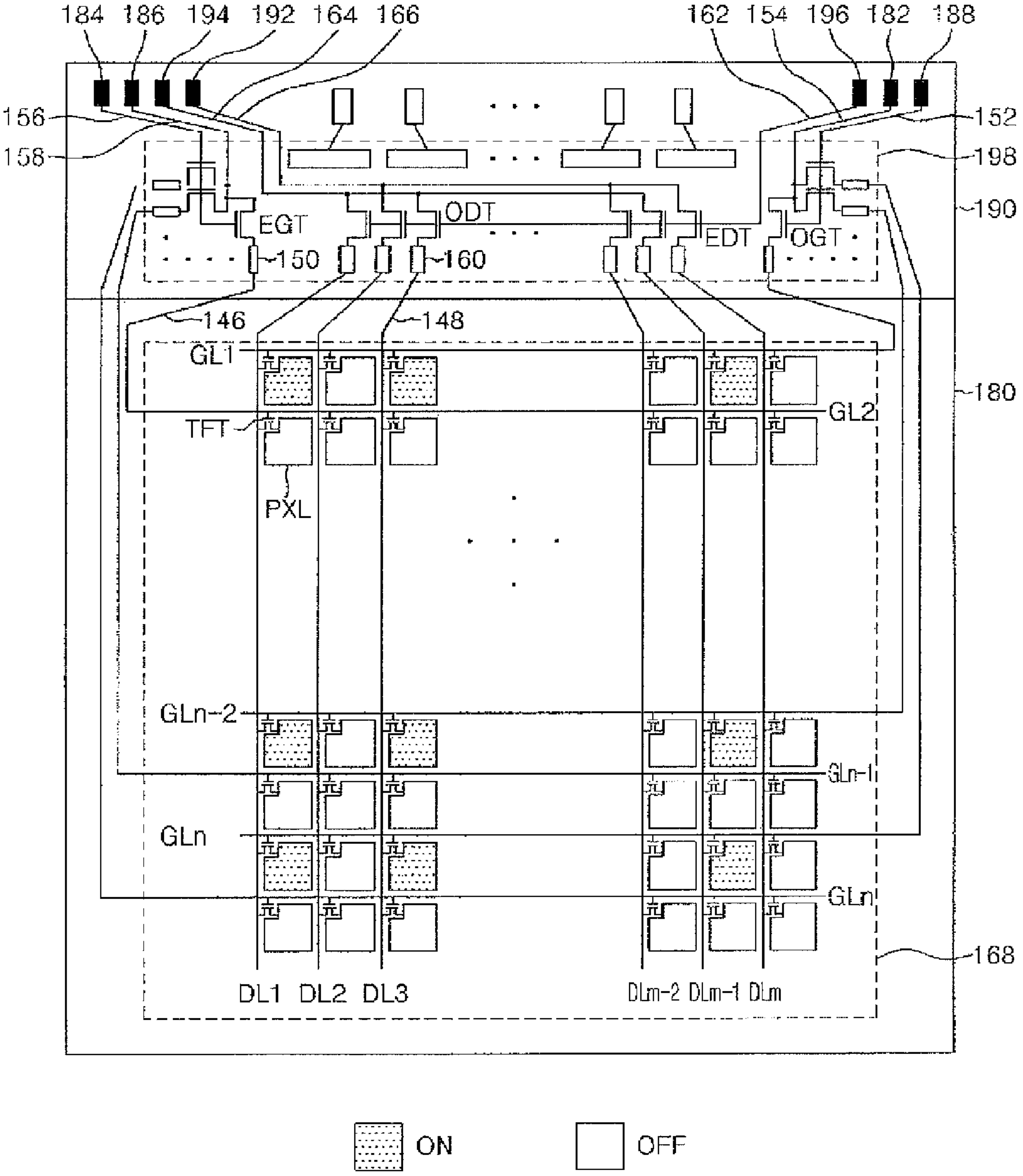
FIGS. 4A and 4B are copies of FIG. 2 marked for describing a testing process of the LCD panel of FIG. 2.
Figure 4B:
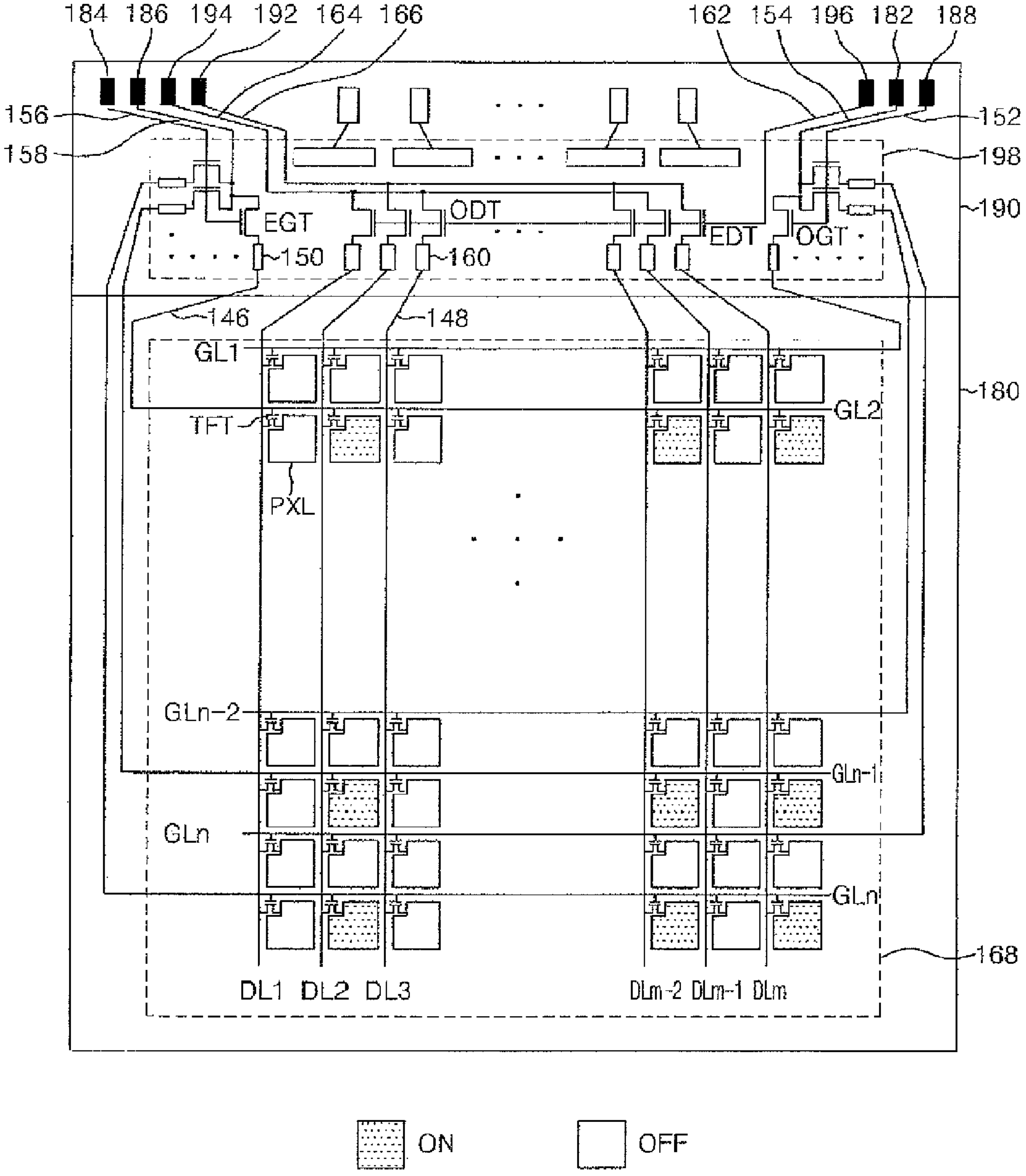

FIGS. 4A and 4B copies of FIG. 2 marked for describing a testing process of the LCD panel of FIG. 2.

The odd gate test transistors OGT are turned ON by the gate control signal received from the odd gate control pad 188 and line 152. A gate test signal GTS (FIG. 3) is transmitted to the odd gate lines GL1, GL3, . . . , GLn−1, through the odd gate test pad 182 and line 154 through the turned-ON odd gate test transistors OGT. The pixel transistors TFT connected to the odd gate lines GL1, GL3, . . . , GLn−1 are turned ON in response to the gate test signal GTS received from the odd gate lines GL1, GL3, . . . , GLn−1.

The odd data test transistors ODT are turned ON in response to the data control signal received from the data control pad 196 and line 162. The data test signal received from the odd data test pad 194 and line 164 is transmitted to the odd data lines DL1, DL3, . . . , DLm−1 through the turned-ON odd data test transistors ODT. Then the data test signal is transmitted through the turned-ON pixel transistors TFT to odd liquid crystal cells positioned in pixel region between the odd data lines DL1, DL3, . . . , DLm−1 and the odd gate lines GL1, GL3, . . . , GLn−1, as illustrated in FIG. 4A, where the dotting in pixels indicates the pixels are activated ON.

Next (e.g., during the next phase of testing) the even gate test transistors EGT are turned ON by the gate control signal received from the even gate control pad 184 and line 156. The gate test signal GTS is transmitted to the even gate lines GL2, GL4, . . . , GLn, as indicated in FIG. 3, through the even gate test pad 186 and line 158 through the turned-ON even gate test transistors EGT. The pixel transistors TFT connected to the even gate lines GL2, GL4, . . . , GLn are turned ON in response to the gate test signal received from the even gate lines GL2, GL4, . . . , GLn.

The even data test transistors EDT are turned ON in response to the data control signal received from the data control pad 196 and line 162. The data test signal received from the even data test pad 192 and line 166 is transmitted to the even data lines DL2, DL4, . . . , DLm through the turned-ON even data test transistors EDT. Then the data test signal is supplied through the turned-ON pixel transistors TFT to even liquid crystal cells positioned in pixel regions between the even data lines DL2, DL4, . . . , DLm and the even gate lines GL2, GL4, . . . , GLn, as shown in FIG. 4B, where the dotting in pixels indicates the pixels are activated ON.

After the testing process, if the LCD panel is judged to be of good quality, a driver IC is fixed in the package region 198 in the peripheral area 190. Output terminals of the driver IC are connected to the gate pads 150 and the data pads 160. At this time, the odd and even data test transistors ODT and EDT and the odd and even gate test transistors OGT and EGT are turned OFF (e.g., permanently OFF). Hence, gate signals generated from the driver IC are supplied to the gate lines GL through the gate pads 150, and data signals generated from the driver IC are supplied to the data lines DL through the data pads 160.

As described previously, in the LCD panel according to the second embodiment of the present invention, since the test transistors including the odd and even data test transistors ODT and EDT and the odd and even gate test transistors OGT and EGT are arranged in the package region 198 in the peripheral area 190, additional space for arranging the test thin film transistors (test TFTs) is unnecessary and the area of the substrate can be maximally used. Moreover, since a test signal is supplied to the signal lines through the test transistors OGT, EGT, ODT and EDT, the signal pads 150 and 160, and the signal links 146 and 148, it is possible to detect defects in the signal links 146 and 148 (e.g., being opened) as well as defects in the signal lines GL and DL. Further, during the testing process, since the test signal is supplied to the signal lines GL and DL through the signal pads 150 and 160 and the signal links 146 and 148, the resistive (R) and capacitive (C) path of the test signal is relatively shortened. Hence, an RC delay of the test signal caused by the resistances R and capacitors C contained in the respective signal lines 152, 154, 156, 158, 162, 164 and 166 is avoided, and the distortion of the test signal is reduced.

However, in the LCD panel according to the second embodiment of the present invention, since the gate pads 150 are arranged in an “L” shape, it is difficult to arrange the test transistors OGT, EGT, ODT and EDT in the package region 198. Moreover, as the driver IC becomes smaller (e.g., by increase integration), the pitch (e.g., spacing) between the gate pads 150 and the data pads 160 is greatly reduced and thus it may be difficult to arrange the test transistors OGT, EGT, ODT and EDT within the narrow space.

Moreover, the pixel TFTs connected to the odd (or even) gate lines and odd (or even) data lines are simultaneously turned ON as indicated in FIGS. 4A and 4B. Therefore, a relatively large amount of load (current) is conducted across the odd (or even) data test pads (192, 196) which supply the data test signal to the odd (or even) data lines. In a panel of 176×220 resolution for example, a load current of (176×3/2)×(220/2)×(Clc+Cst) is conducted across the odd (or even) data test pad (192 or 196). Then the data test signal may be distorted by this large load.

Figure 5:
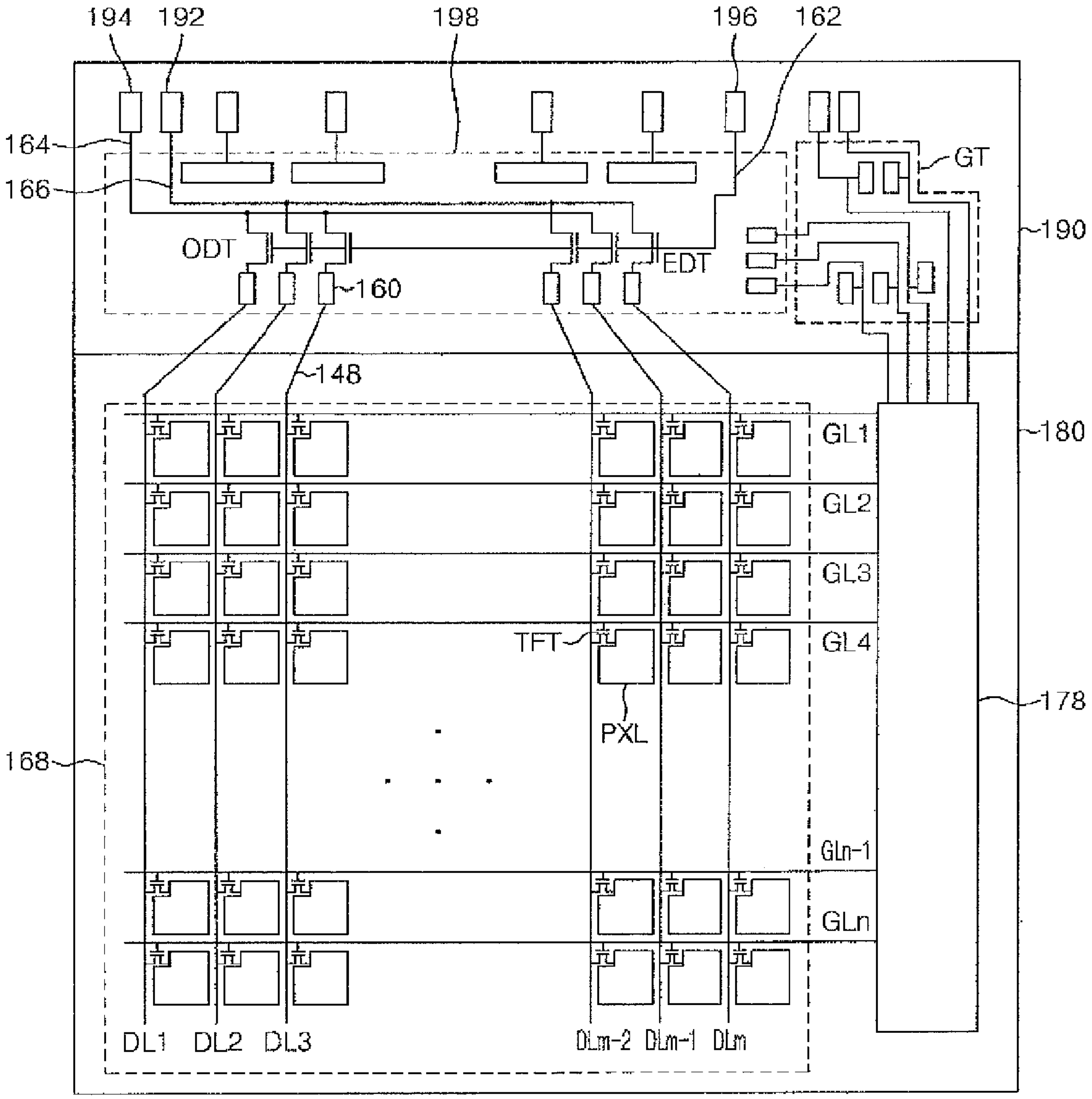
FIG. 5 is a plane view of an LCD panel according to a third embodiment of the present invention.

FIG. 5 is a plane view of an LCD panel according to a third embodiment of the present invention. The LCD panel shown in FIG. 5 includes a display area 180 and a peripheral area 190.

The LCD panel shown in FIG. 5 includes pixel transistors TFT and pixel electrodes PXL (formed in pixel regions defined by the intersections of gate lines GL and data lines DL), odd and even data test transistors ODT and EDT (connected to the data lines DL of a display region 168), and a gate driver 178 connected to the gate lines GL of the display region 168.

The odd data test transistors ODT include respective transistor gate electrodes (connected to a data control pad 196 and line 162), respective transistor source electrodes (connected to an odd data test pad 194 and line 164), and respective transistor drain electrodes (connected through odd data pads 160 to odd data lines DL1, DL3, . . . , DLm−1). The odd data test transistors ODT switchably transmit to the odd data lines DL1, DL3, . . . , DLm−1 a data test signal (received from the odd data test pad 194 and line 164) in response to a data control signal received from the data control pad 196 and line 162. Since the odd data test transistors ODT are formed within a package region 198 in the peripheral area 190, the area utilization efficiency of the substrate is improved.

The even data test transistors EDT include respective transistor gate electrodes (connected to the data control pad 196 and line 162), respective source electrodes (connected to an even data test pad 192 and line 166), and respective transistor drain electrodes (connected through even data pads 160 to even data lines DL2, DL4, . . . , DLm). The even data test transistors EDT switchably transmit to the even data lines DL2, DL4, . . . , DLm a data test signal (received from the even data test pad 192 and line 166) in response to the data control signal received from the data control pad 196 and line 162. Since the even data test transistors EDT are formed within the package region 198 in the peripheral region 190, the are utilization efficiency of the substrate is improved.

The gate driver 178 comprises a plurality of polysilicon or amorphous silicon thin film transistors formed on the LCD panel. The gate driver 178 includes a shift register (see FIG. 6) for sequentially supplying a scanned pulse to the gate lines GL1 to GLn of the display region 168.

Figure 6:
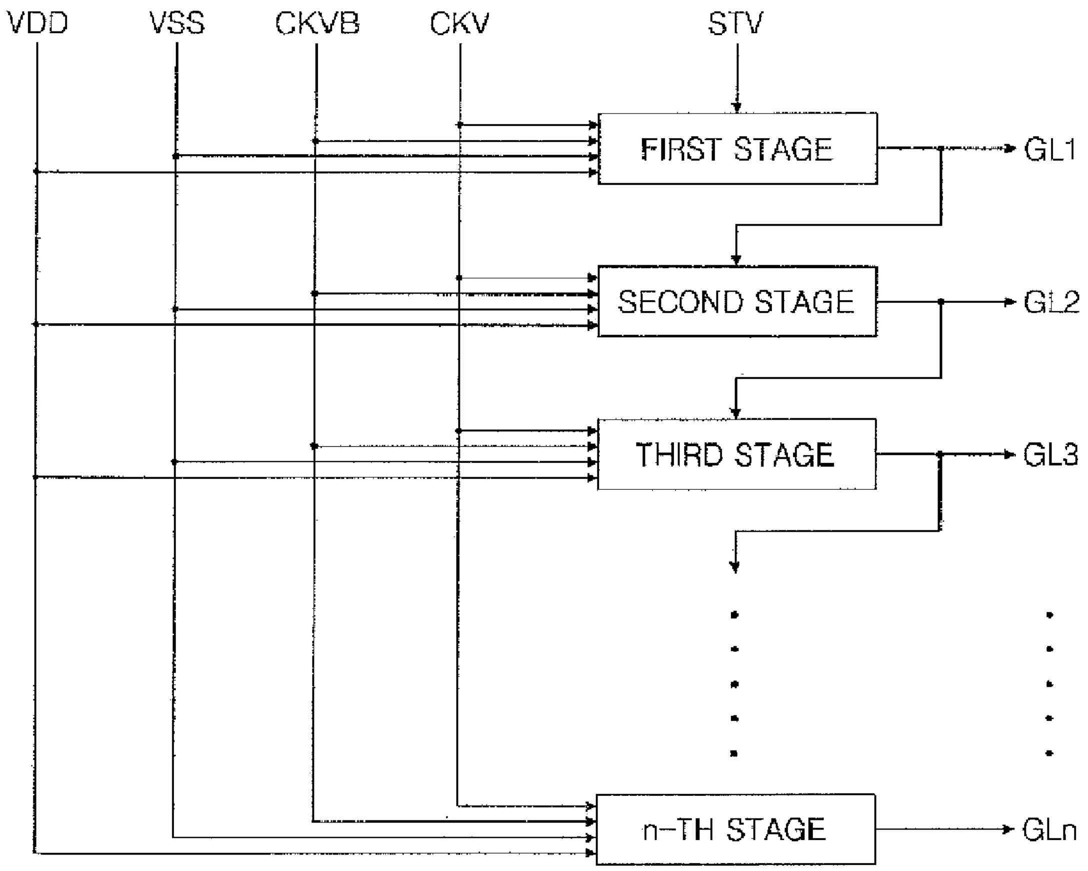
FIG. 6 is a block diagram illustrating the gate driver 178 shown in FIG. 5.

FIG. 6 is a block diagram illustrating the gate driver 178 shown in FIG. 5.

Referring to FIG. 6, the shift register includes, first to n-th stages connected in cascade to each other. High and low potential voltages VDD and VSS and first and second clock signals CKV and CKVB are commonly supplied to the first to n-th stages. A start pulse STV or an output signal of the previous stage is also supplied to the first to n-th stages. The first stage supplies a scan pulse to the first gate line GL1 in response to the start pulse STV and the clock signals CKV and CKVB. The second to n-th stages sequentially supply a scan pulse to the second to n-th gate lines GL2 to GLn in response to the output signal of the previous stage and the clock signals CKV and CKVB.

Figure 7:
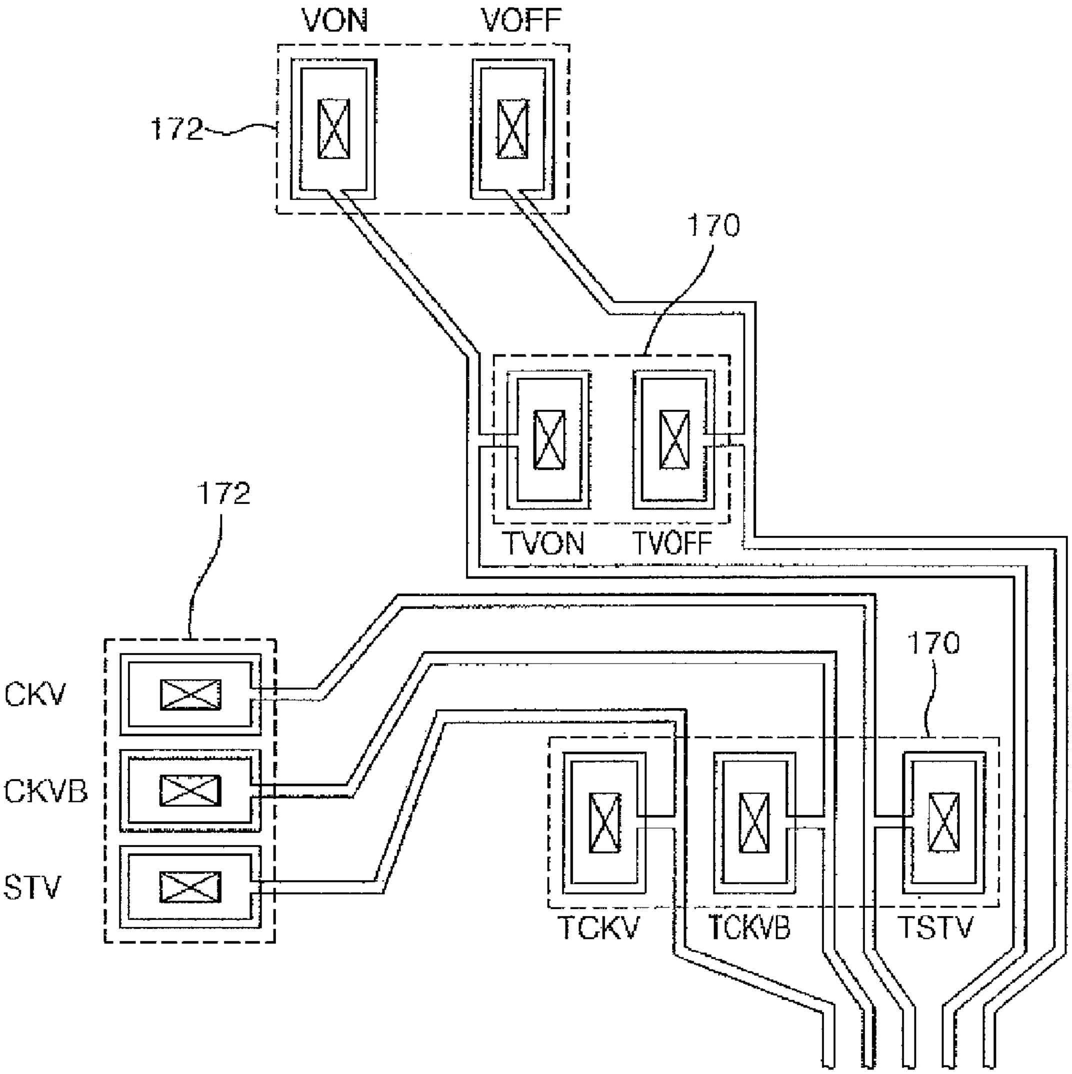
FIG. 7 is a plane view illustrating the gate tester GT shown in FIG. 5.

FIG. 7 is a plane view illustrating the gate tester GT shown in FIG. 5. Referring to FIGS. 6 and 7, during a normal driving operation, the gate driver 178 generates a scan pulse by using a driving signal applied to a signal supplying pad 172, such as a VON pad, VOFF pad, CKV pad, CKVB pad and STV pad. The scan pulse generated by the gate driver 178 is sequentially supplied to the gate line GL.

The gate driver 178 generates, during a testing process, a gate test signal GTS by using a driving signal applied through a probe to a test signal supplying pad 170, such as a TVON pad, TVOFF pad, TCKV pad, TCKVB pad and TSTV pad.

Thus the LCD panel (of FIG. 5) according to the third embodiment of the present invention enables detection of defects in the signal lines and in pixel transistors by using the odd and even data test transistors ODT and EDT and the test signal supplying pad 170. This signal testing process will now be further described with reference to FIGS. 8, 9A and 9B.

Figure 8:
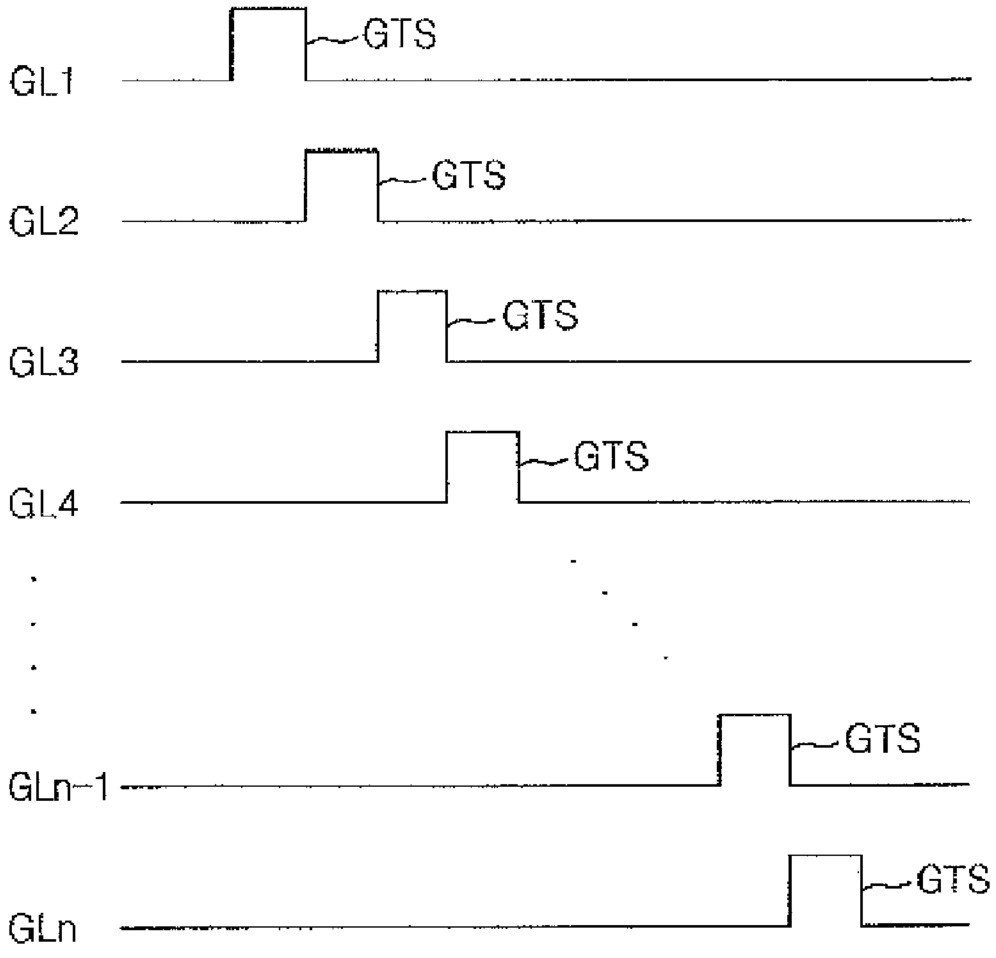
FIG. 8 is a waveform diagram illustrating a gate test signal applied to gate lines during a testing process of the LCD panel of FIG. 5.

FIG. 8 is a waveform illustrating a gate test signal GTS applied to gate lines GL during a testing process of the LCD panel of FIG. 5. The gate driving signal GTS generated by the gate driver 178 is sequentially supplied to the gate lines GL as illustrated in FIG. 8.

Figure 9A:
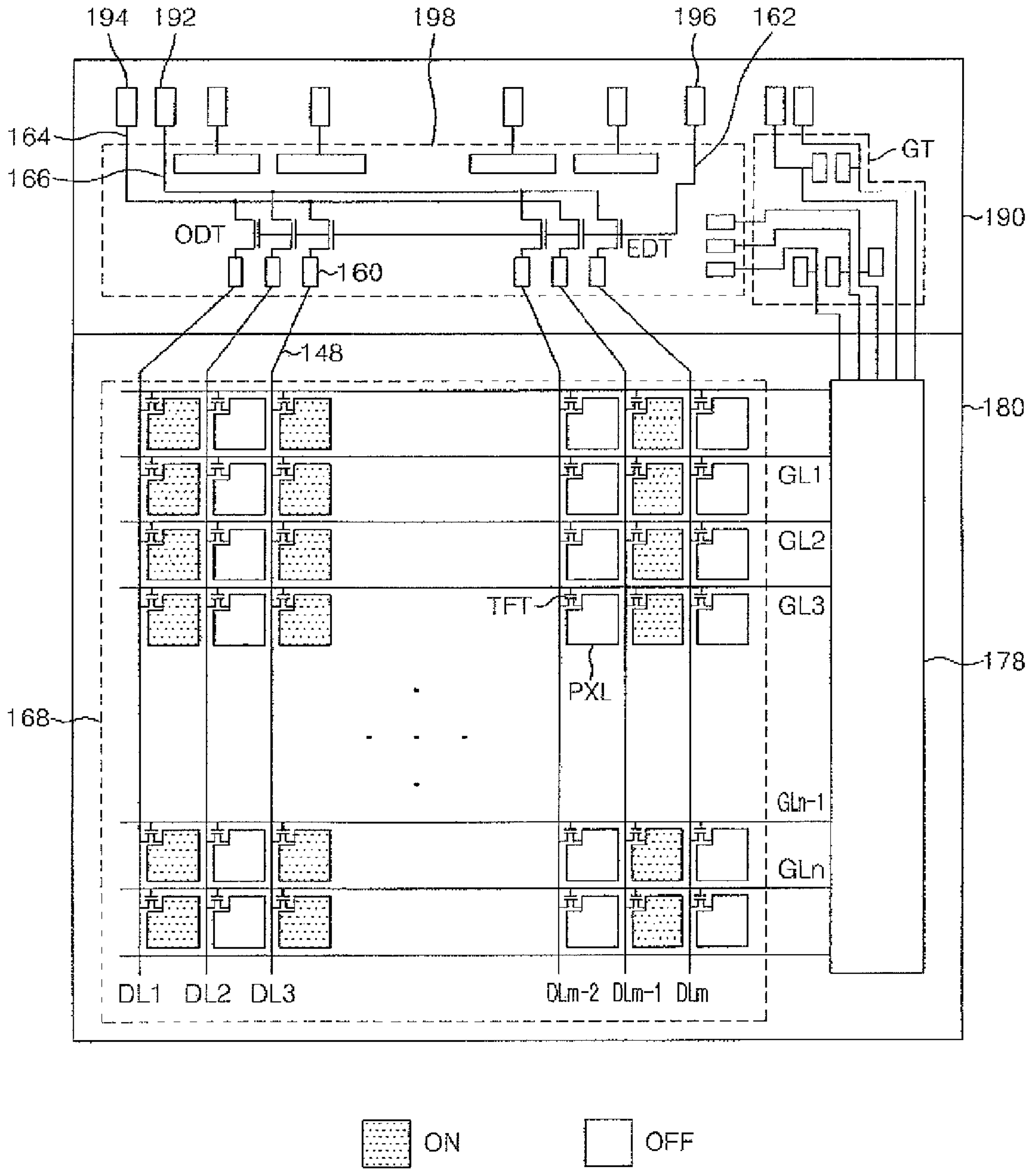
FIGS. 9A and 9B are copies of FIG. 5 marked for describing a testing process of the LCD panel of FIG. 5.
Figure 9B:
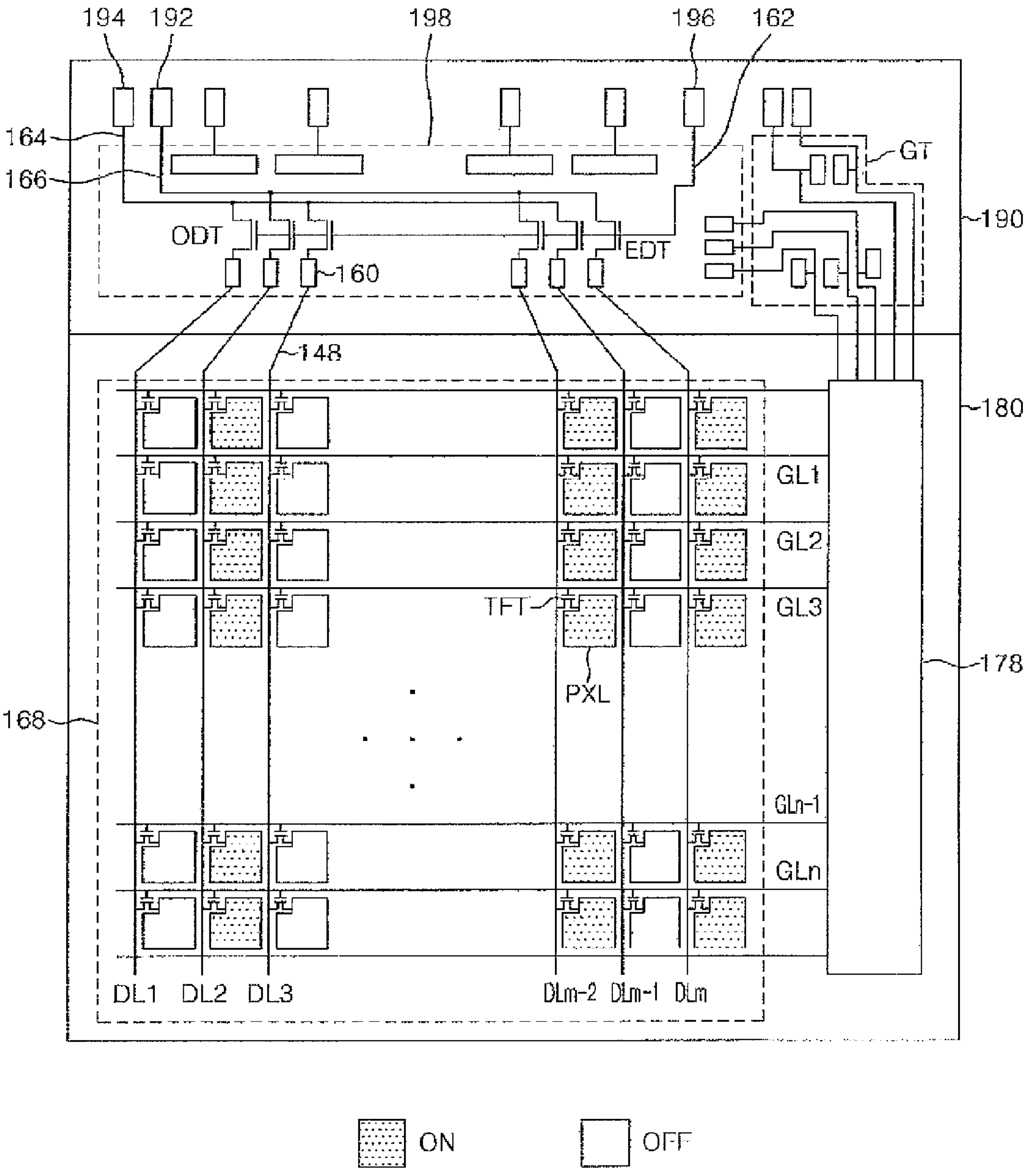

FIGS. 9A and 9B are copies of FIG. 5 marked for describing a testing process of the LCD panel of FIG. 5. FIG. 9A depicts odd pixels being activated and tested. FIG. 9B depicts even pixels being activated and tested.

The gate driver 178 (FIG. 9A) generates the gate test signal GTS by using the driving signal supplied to the test signal supplying pad 170. The first to n-th gate lines GL1 to GLn are sequentially driven in response to the gate test signal GTS. (See FIG. 8) The pixel transistors TFT are turned ON by the gate test signal GTS. The odd data test transistors ODT are turned ON in response to the data control signal received from the data control pad 196 and line 162. The data test signal received from the odd data test pad 194 and line 164 is supplied to the odd data lines DL1, DL3, . . . , DLm−1 thorough the turned-ON odd data test transistors ODT. Then the data test signal is supplied to liquid crystal (LC) cells connected to the odd data lines DL1, DL3, . . . , DLm−1 through the turned-ON pixel transistors TFT as illustrated in FIG. 9A.

Then the gate driver 178 (FIG. 9B) again generates the gate test signal GTS by using the driving signal supplied to the test signal supplying pad 170. The first to n-th gate lines GL1 to GLn are again sequentially driven in response to the gate test signal GTS. The pixel transistors TFT are turned ON by the gate test signal GTS. The even data test transistors EDT are turned ON in response to the data control signal received from the data control pad 196 and line 162. The data test signal received from the even data test pad 192 and line 166 is supplied to the even data lines DL2, DL4, . . . , DLm through the turned-ON even data test transistors EDT. Then the data test signal is supplied to liquid crystal LC cells connected to the even data lines DL2, DL4, . . . , DLm through the turned-ON pixel transistors TFT as illustrated in FIG. 9B.

After the testing process, if the LCD panel is judged to have good quality, a (data) driver IC is fixed to the package region 198 in the peripheral area 190. Output terminals of the (data) driver IC are connected to the signal supplying pad 172 (See FIGS. 5 and 7) and the data pads 160 (FIG. 5). Hence, a gate signal generated from the (data) driver IC is supplied to the gate driver 178 through the signal supplying pad 172. A data signal generated from the (data) driver IC is supplied to the data lines DL through the data pads 160. At this time, the odd and even data test transistors ODT and EDT are turned OFF, and may never be turned ON again.

As described previously, in the LCD panel (of FIG. 5) according to the third embodiment of the present invention, the odd and even data test transistors ODT and EDT are arranged in the driving package region 198 in the peripheral area 190. Accordingly, additional area for arranging the odd and even data test transistors ODT and EDT is unnecessary and substrate area can be maximally used.

Moreover, since the test signal is switchably supplied to the signal lines through the externally controlled test transistors, the signal pads and the signal links, it is possible to detect defects in the signal links 148 (e.g., opened) as well as defects in the signal lines.

Furthermore, during the testing process, since the test signal is supplied to the data lines DL through the data pads 160 and the data links 148, the resistive (R) and capacitive (C) path of the test signal is relatively shortened. Hence, the RC delay of the test signal caused by the resistances R and capacitors C of the respective signal lines GL, DL, 154, 158, 164 and 166 is reduced, and the distortion of the test signal is reduced.

During the testing process, the LCD panel (of FIG. 5) according to the third embodiment of the present invention sequentially drives the gate lines GL by using the gate driver 178 formed on the substrate. Thus, only the (m/2) thin film transistors TFT connected to the gate line GL to which the gate test signal is currently applied are simultaneously turned ON at a time. Therefore, the load across the odd (or even) data test pads 194 (or 192) is reduced and therefore a distortion of the test signal is prevented. In a panel of 176×220 resolution for example, a load current of only (176×3/2)×(Clc+Cst) is conducted across the odd (or even) data test pad 194 (or 192) at a time. This current load value is much less than the load on the data test pad shown in FIG. 4.

Meanwhile, in the LCD panel (of FIG. 5) according to the third embodiment of the present invention, since the distortion of the test signal is relatively reduced, at least one of the test transistors and the pixel transistors can be decreased in size. Then the area occupied by the test transistors in the package region 198 in the peripheral area 190 becomes relatively smaller.

As described above, the LCD panel and manufacturing and testing methods thereof can detect defects in the signal links 148 (e.g., being open) as well as in the signal lines (DL, GL).

Further, a delay of the test signal caused by the resistances (R) and capacitances (C) contained in the signal lines is reduced and thereby the distortion of the test signal is reduced.

Moreover, during the testing process, the gate lines GL are sequentially driven (not simultaneously driven) by using the gate driver 178 formed on the substrate of the LCD panel. Then only the pixel thin film transistors TFTs connected to the gate line GL to which the gate test signal is currently) applied are simultaneously turned ON. Therefore, the entire test current load on the odd (or even) data test pad 194 (or 192) is reduced and the distortion of the test signal is prevented.

While the invention has been shown and described with reference to a certain preferred embodiments thereof, those ordinarily skilled in the art can readily appreciate that the driving IC "package region" is predetermined and is provided and configured to receive the Driver IC "package" when it will be attached (e.g., after successful testing). The "package region" receives the driving IC "package". Further, the driving IC "package" may comprise a driving IC chip plus additional chip-packaging components and mounting connectors, or the driving IC "package" may consist essentially of the Driver IC chip. In the claims, the driving IC "package region" is predetermined and is provided and configured to receive a driving IC "package" (of whatever form it may be) when it will be attached (e.g., after successful testing).

It will be understood by those skilled in the art that art that various changes in form and details may be made therein without departing from the spirit and scope of the invention as defined by the appended claims.

What is claimed is:

1. A display device comprising:
- a substrate;
- a plurality of signal lines formed on the substrate;
- a plurality of pixels each being connected to a corresponding signal line of the signal lines;
- a plurality of test transistors configured to test the signal lines; and
- a driving integrated circuit mounted on the substrate and connected to the signal lines to drive the signal lines,
- wherein the test transistors are formed in a package region in which the driving integrated circuit is mounted.

2. The display device of claim 1, wherein the signal lines comprise gate lines and data lines intersecting the gate lines, and
- the driving integrated circuit is connected to the data lines and the gate lines.

3. The display device of claim 2, wherein the test transistors comprise:
- a plurality of data test transistors connected to the data lines and formed in the package region; and
- a plurality of gate test transistors connected to the gate lines and formed in the package region.

4. The display device of claim 3, wherein the data test transistors comprise:
- odd-numbered data test transistors connected to odd-numbered data lines among the data lines; and
- even-numbered data test transistors connected to even-numbered data lines among the data lines.

5. The display device of claim 4, further comprising:
- an odd-numbered data test pad and an odd data test line configured to supply a data test signal to the odd-numbered data test transistors;
- an even-numbered data test pad and an even data test line configured to supply the data test signal to the even-numbered data test transistors; and
- a data control line and a data control pad configured to supply a control signal to gates of the odd-numbered and even-numbered data test transistors.

6. The display device of claim 3, wherein the gate test transistors comprise:
- odd-numbered gate test transistors connected to odd-numbered gate lines among the gate lines; and
- even-numbered gate test transistors connected to even-numbered gate lines among the gate lines.

7. The display device of claim 6, further comprising:
- an odd-numbered gate test line and an odd-numbered gate test pad configured to supply a gate test signal to the odd-numbered gate test transistors;
- an even-numbered gate test line and an even-numbered gate test pad configured to supply the gate test signal to the even-numbered gate test transistors;
- an odd-numbered gate control line and an odd-numbered gate control pad configured to supply a control signal to the gates of the odd-numbered gate test transistors; and
- an even-numbered gate control line and an even-numbered gate control pad configured to supply the control signal to the gates of the even-numbered gate test transistors.

8. The display device of claim 2, wherein the test transistors are turned off when the driving integrated circuit supplies a driving signal to the data lines and the gate lines.

9. The display device of claim 1, wherein the signal lines comprise gate lines and data lines intersecting the gate lines, and the driving integrated circuit is connected to the data lines of the signal lines.

10. The display device of claim 9, wherein the test transistors comprise a plurality of data test transistors connected to the data lines and formed in the package region.

11. The display device of claim 10, further comprising:
- an odd-numbered data test pad and an odd-numbered data test line configured to supply a data test signal to the odd-numbered data test transistors;
- an even-numbered data test pad and an even-numbered data test line configured to supply the data test signal to the even-numbered data test transistors; and
- a data control line and a data control pad configured to supply the control signal to gates of the odd-numbered and even-numbered data test transistors.

12. The display device of claim 9, further comprising a gate driver formed on the substrate and configured to sequentially drive the gate lines.

13. The display device of claim 12, further comprising signal supply pads formed in the package region and configured to supply a driving signal to the gate driver.

14. The display device of claim 13, further comprising a test signal supply pad connected commonly with the signal supply pads and configured to supply a test signal during a testing process.

15. The display device of claim 1, wherein each of the pixels comprises:
- a pixel transistor connected to the corresponding signal line; and
- a pixel electrode connected to the pixel transistor.

16. The display device of claim 1, further comprising a black matrix surrounding a display area in which the pixels are formed, wherein the package region is positioned outside the black matrix.

* * * * *